United States Patent
Chang et al.

(10) Patent No.: US 6,271,138 B1
(45) Date of Patent: Aug. 7, 2001

(54) CHEMICAL MECHANICAL POLISH (CMP) PLANARIZING METHOD WITH ENHANCED CHEMICAL MECHANICAL POLISH (CMP) PLANARIZED LAYER PLANARITY

(75) Inventors: Weng Chang, Taipei; Syun-Ming Jang, Hsin-Chu, both of (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 0 days.

(21) Appl. No.: 09/405,058

(22) Filed: Sep. 27, 1999

(51) Int. Cl.⁷ .................... H01L 21/302; H01L 21/461
(52) U.S. Cl. ................. 438/691; 438/692; 438/695; 216/88
(58) Field of Search .................. 438/691, 692, 438/693, 695; 216/88, 89

(56) References Cited

U.S. PATENT DOCUMENTS

| | | | |
|---|---|---|---|
| 5,173,439 | * 12/1992 | Dash et al. | 437/67 |
| 5,234,867 | 8/1993 | Schultz et al. | 437/225 |
| 5,663,107 | * 9/1997 | Peschke et al. | 438/692 |
| 5,665,656 | 9/1997 | Jairath | 438/692 |
| 5,679,211 | 10/1997 | Huang | 156/643.1 |
| 5,759,906 | * 6/1998 | Lou | 438/623 |
| 5,923,993 | * 7/1999 | Sahota | 438/692 |
| 5,958,795 | * 9/1999 | Chen et al. | 438/692 |

\* cited by examiner

*Primary Examiner*—Benjamin L. Utech
*Assistant Examiner*—Duy-Vu Deo
(74) *Attorney, Agent, or Firm*—George O. Saile; Stephen B. Ackerman; Stephen G. Stanton

(57) ABSTRACT

A chemical mechanical polish (CMP) planarizing method for forming a chemical mechanical polish (CMP) planarized microelectronic layer within a microelectronic fabrication employs first a substrate. There is then formed over the substrate a microelectronic layer. There is then planarized, while employing a chemical mechanical polish (CMP) planarizing method, the microelectronic layer to form a chemical mechanical polish (CMP) planarized microelectronic layer. Within the method, the microelectronic layer when formed over the substrate is formed with a thickness variation which compensates for a chemical mechanical polish (CM) rate non-uniformity when forming while employing the chemical mechanical polish (CMP) planarizing method the chemical mechanical polish (CMP) planarized microelectronic layer from the microelectronic layer.

23 Claims, 1 Drawing Sheet

CHEMICAL MECHANICAL POLISH (CMP) PLANARIZING METHOD WITH ENHANCED CHEMICAL MECHANICAL POLISH (CMP) PLANARIZED LAYER PLANARITY

BACKGROUND OF THE INVENTION

1. Field of the Invention

The present invention relates generally to methods for forming planarized layers within microelectronics fabrications. More particularly, the present invention relates to chemical mechanical polish (CMP) planarizing methods for forming planarized layers within microelectronics fabrications.

2. Description of the Related Art

Microelectronic fabrications are formed from microelectronic substrates over which are formed patterned microelectronic conductor layers which are separated by microelectronic dielectric layers.

As microelectronic fabrication integration levels have increased and microelectronic device and patterned microelectronic conductor layer dimensions have decreased, it has become more common within the art of microelectronic fabrication to employ within microelectronic fabrications multiple vertically disposed patterned microelectronic conductor layers within a microelectronic fabrication in order to provide for greater functionality within the microelectronic fabrication.

While the use within microelectronic fabrications of increased numbers of vertically disposed patterned microelectronic conductor layers will certainly continue in order to provide microelectronic fabrications with increased levels of microelectronic fabrication functionality, microelectronic fabrications are typically not fabricated with increasing numbers of vertically disposed patterned microelectronic conductor layers entirely without problems. In that regard, it is often required when forming microelectronic fabrications with increased numbers of vertically disposed patterned microelectronic conductor layers to employ when forming either or both of: (1) the vertically disposed patterned microelectronic conductor layers; or (2) dielectric layers which separate the vertically disposed patterned microelectronic conductor layers, planarizing methods which provide either or both of those layers with nominally planar surfaces in order to assure that microelectronic fabrications within which are formed the patterned microelectronic conductor layers are formed with acceptable levels of functionality and reliability.

To provide microelectronics layers, including microelectronics conductor layers, microelectronics semiconductor layers and microelectronics dielectric layers, with nominally planar surfaces, it common in the art of microelectronics fabrication to employ planarizing methods such as but not limited to reactive ion etch (RIE) etchback planarizing methods and chemical mechanical polish (CMP) planarizing methods. While chemical mechanical polish (CMP) planarizing methods are in particular desirable within the art of microelectronic fabrication for fabricating microelectronic layers with enhanced planarity, chemical mechanical polish (CMP) planarizing methods are also not entirely without problems within the art of microelectronic fabrication insofar as chemical mechanical polish (CMP) planarizing methods do not always provide an optimally planar surface of a chemical mechanical polish planarized layer within a microelectronic fabrication.

It is thus towards the goal of providing within microelectronic fabrications chemical mechanical polish (CMP) planarized microelectronic layers within enhanced planarity that the present invention is directed.

Various apparatus and methods have been disclosed in the art of microelectronic fabrication for forming planarized layers with desirable properties within microelectronic fabrications.

For example, Schultz, et al., in U.S. Pat. No. 5,234,867, discloses a chemical mechanical polish (CMP) planarizing apparatus and an associated chemical mechanical polish (CMP) planarizing method for chemical mechanical polish (CMP) planarizing a semiconductor substrate with greater uniformity. To realize that object, the chemical mechanical polish (CMP) planarizing apparatus and the chemical mechanical polish (CMP) planarizing method employ a rotating non-circular chemical mechanical polish (CMP) planarizing pad juxtaposed a rotating semiconductor substrate, where at least a portion of the rotating semiconductor substrate is moved beyond an edge of the rotating non-circular chemical mechanical polish (CMP) planarizing pad when chemical mechanical polish (CMP) planarizing the semiconductor substrate.

In addition, Jairath, in U.S. Pat. No. 5,665,656, discloses a chemical mechanical polish (CMP) planarizing apparatus and an associated chemical mechanical polish (CMP) planarizing method for chemical mechanical polish (CMP) planarizing a semiconductor substrate with enhanced uniformity, reduced materials consumption and reduced chemical mechanical polish (CMP) planarizing apparatus size. To realize the foregoing objects, the chemical mechanical polish (CMP) planarizing apparatus and the chemical mechanical polish (CMP) planarizing method employ a rotating semiconductor substrate which is contacted by a lateral edge of a rotating conical polishing pad rather than a planar surface of a rotating planar polishing pad.

Finally, Huang, in U.S. Pat. No. 5,679,211, discloses a reactive ion etch (RIE) etchback planarizing method for forming with enhanced etchback uniformity a reactive ion etch (RIE) etchback planarized spin-on-glass (SOG) planarizing layer within a semiconductor integrated circuit microelectronics fabrication. To realize the foregoing object, the reactive ion etch (RIE) etchback planarizing method employs: (1) a series of sequential and repetitive partial reactive ion etch (RIE) etchback planarizings of the spin-on-glass (SOG) planarizing layer while employing a fluorocarbon containing plasma which forms a series of polymer residue layers upon a corresponding series of partially reactive ion etch (RIE) etchback planarized spin-on-glass (SOG) planarizing layers; followed by (2) an intervening series of sequential and repetitive strippings of the series of polymer residue layers while employing an oxygen containing plasma.

Desirable in the art of microelectronic fabrication are additional chemical mechanical polish (CMP) planarizing methods which may be employed within microelectronic fabrications to provide within microelectronic fabrications chemical mechanical polish (CMP) planarized microelectronic layers within enhanced planarity.

It is towards the foregoing object that the present invention is directed.

SUMMARY OF THE INVENTION

A first object of the present invention is to provide a chemical mechanical polish (CMP) planarizing method for forming a chemical mechanical polish (CMP) planarized microelectronic layer within a microelectronic fabrication.

A second object of the present invention is to provide a chemical mechanical polish (CMP) planarizing method in accord with the first object of the present invention, where the chemical mechanical polish (CMP) planarized microelectronic layer is formed with enhanced planarity.

A third object of the present invention is to provide a chemical mechanical polish (CMP) planarizing method in accord with the first object of the present invention and the second object of the present invention, which method is readily commercially implemented.

In accord with the objects of the present invention, there is provided by the present invention a chemical mechanical polish (CMP) planarizing method for forming a chemical mechanical polish (CMP) planarized microelectronic layer within a microelectronic fabrication. To practice the method of the present invention, there is first provided a substrate. There is then formed over the substrate a microelectronic layer. There is then planarized, while employing a chemical mechanical polish (CMP) planarizing method, the microelectronic layer to form a chemical mechanical polish (CMP) planarized microelectronic layer. Within the method of the present invention, the microelectronic layer when formed over the substrate is formed with a thickness variation which compensates for a chemical mechanical polish (CMP) rate non-uniformity when forming while employing the chemical mechanical polish (CMP) planarizing method the chemical mechanical polish (CMP) planarized microelectronic layer from the microelectronic layer.

The present invention provides a chemical mechanical polish (CMP) planarizing method for forming a chemical mechanical polish (CMP) planarized microelectronic layer within a microelectronic fabrication, where the chemical mechanical polish (CMP) planarized microelectronic layer is formed with enhanced planarity. The method of the present invention realizes the foregoing object by employing when forming a microelectronic layer from which is formed the chemical mechanical polish (CMP) planarized microelectronic layer a thickness variation of the microelectronic layer which compensates for a chemical mechanical polish (CMP) rate non-uniformity when forming while employing the chemical mechanical polish (CMP) planarizing method the chemical mechanical polish (CMP) planarized microelectronic layer from the microelectronic layer.

The method of the present invention is readily commercially implemented. The present invention employs methods and materials as are generally known in the art of microelectronic fabrication, or as illustrated within the Description of the Preferred Embodiment, may readily be implemented within the art of microelectronic fabrication. Since it is a novel use of methods and materials which provides at least in part the present invention, rather than the existence of methods and materials which provides the present invention, the method of the present invention is readily commercially implemented.

BRIEF DESCRIPTION OF THE DRAWINGS

The objects, features and advantages of the invention are understood within the context of the Description of the Preferred Embodiment, which follows. The Description of the Preferred Embodiment is understood within the context of the accompanying drawings, which form a material part of this disclosure, wherein.

DESCRIPTION OF THE PREFERRED EMBODIMENT

The present invention provides a chemical mechanical polish (CMP) planarizing method for forming a chemical mechanical polish (CMP) planarized microelectronic layer within a microelectronic fabrication, where the chemical mechanical polish (CMP) planarized microelectronic layer is formed with enhanced planarity. The method of the present invention realizes the foregoing object by employing when forming a microelectronic layer from which is formed the chemical mechanical polish (CMP) planarized microelectronic layer a thickness variation of the microelectronic layer which compensates for a chemical mechanical polish (CMP) rate non-uniformity when forming while employing the chemical mechanical polish (CMP) planarizing method the chemical mechanical polish (CMP) planarized microelectronic layer from the microelectronic layer.

The method of the present invention may be employed for forming with enhanced planarity chemical mechanical polish (CMP) planarized microelectronic layers within microelectronic fabrications including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Similarly, the method of the present invention may be employed for forming with enhanced planarity within microelectronic fabrications chemical mechanical polish (CMP) planarized microelectronic layers from corresponding microelectronic layers within those microelectronic fabrications, where those corresponding microelectronic layers are formed from microelectronic materials including but not limited to microelectronic conductor materials, microelectronic semiconductor materials and microelectronic dielectric materials.

Figure 1:
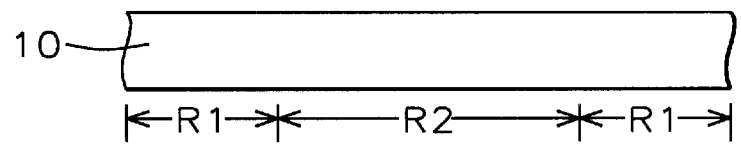
FIG. 1, FIG. 2 and FIG. 3 show a series of schematic cross-sectional diagrams illustrating the results of forming in accord with a preferred embodiment of the present invention a chemical mechanical polish (CMP) planarized microelectronic layer within a microelectronic fabrication.
Figure 2:
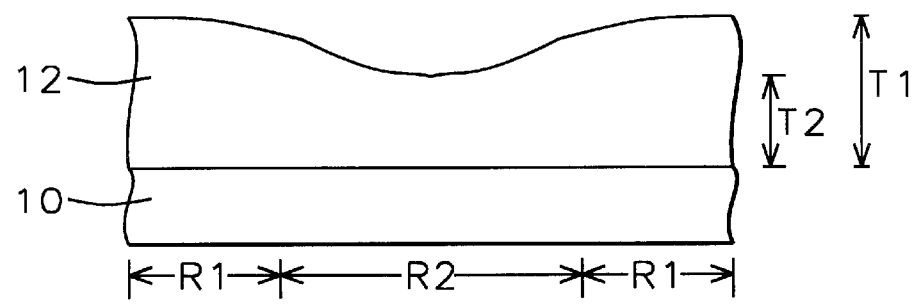
Figure 3:
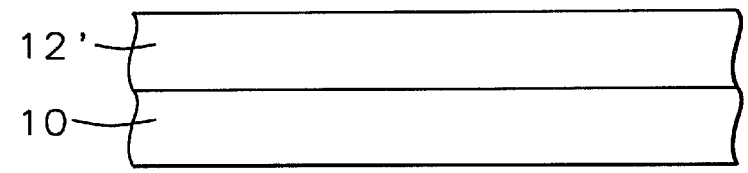

Referring now to FIG. 1 to FIG. 3, there is shown a series of schematic cross-sectional diagrams illustrating the results of forming within a microelectronic fabrication in accord with a preferred embodiment of the present invention a chemical mechanical polish (CMP) planarized microelectronic layer from a microelectronic layer, in accord with the present invention. Shown in FIG. 1 is a schematic cross-sectional diagram of the microelectronic fabrication at an early stage in its fabrication in accord with the present invention.

Shown in FIG. 1 is a substrate 10 which is employed within a microelectronic fabrication, where the microelectronic fabrication may be selected from the group including but not limited to integrated circuit microelectronic fabrications, ceramic substrate microelectronic fabrications, solar cell optoelectronic microelectronic fabrications, sensor image array optoelectronic microelectronic fabrications and display image array optoelectronic fabrications.

Although not specifically illustrated within the schematic cross-sectional diagram of FIG. 1, the substrate 10 may be the substrate itself employed within the microelectronic fabrication, or in the alternative, the substrate 10 may be the substrate employed within the microelectronic fabrication, where the substrate has formed thereupon and/or thereover any of several additional microelectronic layers as are conventionally employed within the microelectronic fabrication within which is employed the substrate 10. Such additional microelectronic layers may include, but are not limited to microelectronic conductor layers, microelectronic semiconductor layer and microelectronic dielectric layers.

Similarly, although also not specifically illustrated within the schematic cross-sectional diagram of FIG. 1, the substrate 10, particularly when the substrate 10 is a semiconductor substrate employed within a semiconductor integrated circuit microelectronics fabrication, will typically and preferably have formed therein and/or thereupon microelectronics devices as are conventional within the microelectronics fabrication within which is employed the substrate 10. Such microelectronics devices may include, but are not limited to resistors, transistors, diodes and capacitors.

Within the preferred embodiment of the present invention, the substrate 10 will more preferably be a silicon semiconductor substrate employed within a semiconductor integrated circuit microelectronic fabrication, where the silicon semiconductor substrate has formed therein and/or thereupon semiconductor integrated circuit microelectronic devices, and the silicon semiconductor substrate also has formed thereupon and/or thereover a patterned microelectronic layer upon which is formed a blanket microelectronics layer which is desired to be planarized employing a chemical mechanical polish (CMP) planarizing method.

Finally, as is illustrated within the schematic cross-sectional diagram of FIG. 1, the substrate 10 is divided into three distinct regions, including two edge regions R1 at the periphery of the substrate 10 and a central region R2 at the center of the substrate 10. Although not specifically illustrated within the schematic cross-sectional diagram of FIG. 1, when viewed as a plan-view diagram of the substrate 10, it is intended that the edge regions R1 provide an annular peripheral region of the substrate 10 which encloses a preferably circular central region R2 of the substrate 10.

Referring now to FIG. 2, there is shown a schematic cross-sectional diagram illustrating the results of further processing of the microelectronic fabrication whose schematic cross-sectional diagram is illustrated in FIG. 1.

Shown in FIG. 2 is a schematic cross-sectional diagram of a microelectronic fabrication otherwise equivalent to the microelectronic fabrication whose schematic cross-sectional diagram is illustrated in FIG. 1, but wherein there is formed upon the substrate 10a blanket microelectronic layer 12. Within the preferred embodiment of the present invention, the blanket microelectronic layer 12 may be formed of microelectronic materials including but not limited to microelectronic conductor materials, microelectronic semiconductor materials and microelectronic dielectric materials.

Similarly, as is illustrated within the schematic cross-sectional diagram of FIG. 2, the blanket microelectronic layer 12 is formed with a greater thickness T1–T2 in both of the edge regions R1 of the substrate 10 than in the central region R2 of the substrate. Within the preferred embodiment of the present invention, the greater thickness T1–T2 of the blanket microelectronic layer 12 in both of the edge regions R1 or the substrate 10 in comparison with the central region R2 of the substrate 10 is of a magnitude which compensates for a chemical mechanical polish (CMP) rate non-uniformity when forming while employing a chemical mechanical polish (CMP) planarizing method a chemical mechanical polish (CMP) planarized blanket microelectronic layer from the blanket microelectronic layer 12. By employing within the preferred embodiment of the present invention the greater thickness T1–T2 of the blanket microelectronic layer 12 at the edge regions R1 of the substrate 10 in comparison with the central region R2 of the substrate 10, the chemical mechanical polish (CMP) planarized blanket microelectronic layer which is formed from the blanket microelectronic layer 12 is formed with greater planarity than a corresponding chemical mechanical polish (CMP) planarized blanket microelectronic layer formed from a corresponding blanket microelectronic layer absent a greater thickness at a pair of edge regions of the blanket microelectronic layer than in a central region of the blanket microelectronic layer.

Within the preferred embodiment of the present invention, the maximum thickness T1 of the blanket microelectronic layer 12 at the edge regions R1 of the substrate 10 is typically and preferably from about 12000 to about 14000 angstroms, while the minimum thickness T2 of the blanket microelectronic layer 12 at the central region R2 of the substrate is typically and preferably from about 1000 to about 12000 angstroms. Thus, typically and preferably, a difference (i.e. variation) of thickness T1–T2 of the blanket microelectronic layer 12 between the edge regions R1 of the substrate 10 and the central region R2 of the substrate 10 is from about 1000 to about 4000 angstroms.

Within the preferred embodiment of the present invention, the greater thickness T1–T2 of the blanket microelectronic layer 12 within the edge regions R1 of the substrate 10 than in the central region R2 of the substrate 10 is desired since it is typical, absent factors which motivate to the contrary, that an increased linear velocity of the blanket microelectronic layer 12 within the edge regions R1 of the substrate 10 in comparison with the central region R2 of the substrate 10 will typically lead to a greater chemical mechanical polish (CMP) polishing rate when chemical mechanical polish (CMP) planarizing the blanket microelectronic layer 12.

The method of the present invention is not, however, limited to a situation where a blanket microelectronic layer, such as the blanket microelectronic layer 12, is formed with a greater thickness at edge regions of the blanket microelectronic layer over a substrate than at a central region of the blanket microelectronic layer over the substrate. Motivating factors, such as, for example and without limitation, underlying topographic substrate layer features (including areal density thereof and physical hardness thereof) upon which is formed the blanket microelectronic layer, may provide a situation where it is desirable for a central region of a blanket microelectronic layer to be formed with a greater thickness than edge regions of the blanket microelectronic layer to provide for proper compensation of a chemical mechanical polish (CMP) rate non-uniformity when chemical mechanical polish (CMP) planarizing the blanket microelectronic layer to form a chemical mechanical polish (CMP) planarized blanket microelectronic layer.

Within the preferred embodiment of the present invention, the difference in thickness T1–T2 of the blanket microelectronic layer 12 upon the edge regions R1 of the substrate 10 in comparison with the central region of the substrate 10 may be effected employing any of several methods as are known in the art of microelectronic fabrication to provide the blanket microelectronic layer 12 with such a difference in thickness T1–T2. Such methods may include processes which effect that result either before, during or after the blanket microelectronic layer 12 is being formed. More specifically, such methods may include, but are not limited to, methods which employ a thermal gradient within the edge regions R1 of the substrate 10 in comparison with the central region R2 of the substrate 10, as well as methods which provide a greater density of reactant materials from which is formed the blanket microelectronic layer 12 within the edge regions R1 of the substrate 10 in comparison with the central region R2 of the substrate 10. More particularly, within the preferred embodiment of the present invention, the blanket microelectronic layer 12 is formed with the greater thickness T1–T2 upon the end regions R1 of the substrate 10 in comparison with the central region R2 of the substrate 10 by employing a differential thermal gradient with the central region R2 of the substrate 10 having a lower temperature than the edge regions R1 of the substrate 10 while the blanket microelectronic layer 12 is formed employing a deposition method, such as but not limited to a chemical vapor deposition (CVD) method or a physical vapor deposition (PVD) method which has a temperature susceptibility to a deposition rate.

Referring now to FIG. 3, there is shown a schematic cross-sectional diagram illustrating the results of further processing of the microelectronic fabrication whose schematic cross-sectional diagram is illustrated in FIG. 2. Shown in FIG. 3 is a schematic cross-sectional diagram of a microelectronic fabrication otherwise equivalent to the microelectronic fabrication whose schematic cross-sectional diagram is illustrated in FIG. 2, but wherein the blanket microelectronic layer 12 has been chemical mechanical polish (CMP) planarized to form a chemical mechanical polish (CMP) planarized blanket microelectronic layer 12'. As is illustrated within the schematic cross-sectional diagram of FIG. 3, the chemical mechanical polish (CMP) planarized blanket microelectronic layer 12' is formed with substantial planarity since when forming the blanket microelectronic layer 12 from which is formed the chemical mechanical polish (CMP) planarized blanket microelectronic layer 12' there was employed a thickness variation of the blanket microelectronic layer 12 such that there is compensated a chemical mechanical polish (CMP) rate non-uniformity when forming the chemical mechanical polish (CMP) planarized blanket microelectronic layer 12' from the blanket microelectronic layer. Within the present invention, use of the terminology "substantial planarity" is intended to indicate a variation of up to about 500 angstroms from a true plane.

Within the preferred embodiment of the present invention, a chemical mechanical polish (CMP) planarizing method which may be employed for chemical mechanical polish (CMP) planarizing the blanket microelectronic layer 12 when forming the chemical mechanical polish (CMP) planarized blanket microelectronic layer 12' typically and preferably employs a chemical mechanical polish (CMP) slurry composition appropriate to a microelectronic material from which is formed the blanket microelectronic layer 12.

EXAMPLE

There was obtained an eight inch diameter (100) silicon semiconductor substrate which was fixtured into an apparatus which employed a high density plasma chemical vapor deposition (HDP-CVD) method for forming a dielectric layer upon the eight inch diameter (100) silicon semiconductor substrate. A high density plasma chemical vapor deposition (HDP-CVD) method is understood by a person skilled in the art to be a plasma enhanced chemical vapor deposition (PECVD) method undertaken simultaneously with an inert gas sputtering method, where a deposition rate within the plasma enhanced chemical vapor deposition (PECVD) method exceeds a sputtering rate within the inert gas sputtering method. The eight inch diameter (100) silicon semiconductor substrate was fixtured upon a thermally conductive chuck which provided: (1) a temperature of about 420 degrees centigrade at an annular edge region of the silicon semiconductor substrate of annular width of about 30 millimeters which included the circumferential edge of the eight inch diameter (100) silicon semiconductor substrate; and (2) a temperature of about 390 degrees centigrade within a circular central region of the eight inch diameter (100) silicon semiconductor substrate.

There was then formed upon the eight inch diameter (100) silicon semiconductor substrate a fluorosilicate glass (FSG) dielectric layer while employing the high density plasma chemical vapor deposition (HDP-CVD) method which employed: (1) silane as a silicon source material; (2) oxygen as an oxidant source material; (3) silicon tetrafluoride as both a silicon source material and a fluorine source material; and (4) argon as a sputtering source material. The high density plasma chemical vapor deposition (HDP-CVD) method also employed: (1) a reactor chamber pressure of about 6 mtorr; (2) a source radio frequency power of about 4400 watts at a source radio frequency of 13.56 MHZ; (3) a bias sputtering power of about 2500 watts; (4) a silane flow rate of about 40 standard cubic centimeters per minute (sccm); (5) an oxygen flow rate of about 145 standard cubic centimeters per minute (sccm); (6) a silicon tetrafluoride flow rate of about 60 standard cubic centimeters per minute (sccm); and (7) an argon flow rate of about 60 standard cubic centimeters per minute (sccm).

The thickness of the high density plasma chemical vapor deposited (HDP-CVD) fluorosilicate glass (FSG) dielectric layer was then measured at the edge regions and the central region while employing interferometric measurement methods as are conventional in the art of microelectronic fabrication.

The high density plasma chemical vapor deposited (HDP-CVD) fluorosilicate glass (FSG) dielectric layer was then chemical mechanical polish (CMP) planarized employing a chemical mechanical polish (CMP) planarizing method as is otherwise conventional in the art of microelectronic fabrication. The chemical mechanical polish (CMP) planarizing method employed: (1) a platen pressure of about 7 pounds per square inch (psi); (2) a head rotation speed of about 40 revolutions per minute (rpm); (3) a platen counter-rotation speed of about 40 revolutions per minute (rpm); (4) a substrate temperature of about 25 degrees centigrade; (5) an aqueous silica polishing slurry at a concentration of about 12 weight percent and a flow rate of about 200 cubic centimeters per minute (ccm).

The thickness of the chemical mechanical polish (CMP) planarized high density plasma chemical vapor deposited (HDP-CVD) fluorosilicate glass (FSG) layer was then measured at the edge regions and at the central region employing the interferometric method as employed for measuring the thickness of the high density plasma chemical vapor deposited (HDP-CVD) fluorosilicate glass (FSG) layer prior to chemical mechanical polish (CMP) planarization.

The thicknesses of the high density plasma chemical vapor deposited (HDP-CVD) fluorosilicate glass (FSG) layer and the chemical mechanical polish (CMP) planarized high density plasma chemical vapor deposited (HDP-CVD) fluorosilicate glass (FSG) layer are reported in Table I.

TABLE I

|  | Edge Thickness (angstroms) | Center Thickness (angstroms) |
| --- | --- | --- |
| HDP-CVD FSG Layer as Deposited | 18500 +/− 500 | 16500 +/− 500 |
| HDP-CVD FSG Layer after CMP | 12000 +/− 800 | 12000 +/− 800 |

As is seen from review of the data within Table 1, there is observed for the chemical mechanical polish (CMP) planarized high density plasma chemical vapor deposited (HDP-CVD) fluorosilicate glass (FSG) dielectric layer formed in accord with the example of the present invention a uniform thickness in both edge regions and central regions since the chemical mechanical polish (CMP) planarized high density plasma chemical vapor deposited (HDP-CVD) fluorosilicate glass (FSG) dielectric layer was formed employing a high density plasma chemical vapor deposited (HDP-CVD) fluorosilicate glass (FSG) dielectric layer with thickness variations intended to compensate chemical mechanical polish (CMP) planarizing rate non-uniformities when forming the chemical mechanical polish (CMP) planarized high density plasma chemical vapor deposited (HDP-CVD) fluorosilicate glass (FSG) dielectric layer while employing the chemical mechanical polish (CMP) planarizing method.

As is understood by a person skilled in the art, the preferred embodiment and example of the present invention are illustrative of the present invention rather than limiting of the present invention. Revisions and modifications may be made to methods, materials, structures and dimensions through which is formed a chemical mechanical polish (CMP) planarized microelectronic layer in accord with the preferred embodiment and example of the present invention while still providing chemical mechanical polish (CMP) planarized microelectronic layers in accord with the present invention, as defined by the appended claims.

What is claimed is:

1. A chemical mechanical polish (CMP) planarizing method for forming a chemical mechanical polish (CMP) planarized microelectronic layer within a microelectronic fabrication comprising:

providing a substrate;

forming over the substrate a microelectronic layer; wherein the microelectronic layer, when formed over the substrate, is formed with a thickness variation which compensates for a chemical mechanical polish (CMP) rate non-uniformity of a chemical mechanical polish (CMP) planarizing method, and wherein the microelectronic layer has a greater thickness at an edge of the substrate than at the center of the substrate;

planarizing, while employing the chemical mechanical polish (CMP) planarizing method having the chemical mechanical polish (CMP) rate non-uniformity, the microelectronic layer to form a chemical mechanical polish (CMP) planarized microelectronic layer when forming while employing the chemical mechanical polish (CMP) planarizing method the chemical mechanical polish (CMP) planarized microelectronic layer from the microelectronic layer.

2. The method of claim 1 wherein the thickness variation which compensates for the chemical mechanical polish (CMP) rate non-uniformity provides the chemical mechanical polish (CMP) planarized microelectronic layer with enhanced planarity.

3. The method of claim 1 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

4. The method of claim 1 wherein the microelectronic layer is selected from the group consisting of microelectronic conductor layers, microelectronic semiconductor layers and microelectronic dielectric layers.

5. A chemical mechanical polish (CMP) planarizing method for forming a chemical mechanical polish (CMP) planarized microelectronic layer within a microelectronic fabrication comprising:

providing a substrate;

forming over the substrate a microelectronic layer; wherein the microelectronic layer, when formed over the substrate, is formed with a thickness variation which compensates for a chemical mechanical polish (CMP) rate non-uniformity of a chemical mechanical polish (CMP) planarizing method, and wherein the microelectronic layer has a greater thickness at the center of the substrate than at an edge of the substrate;

planarizing, while employing the chemical mechanical polish (CMP) planarizing method having the chemical mechanical polish (CMP) rate non-uniformity, the microelectronic layer to form a chemical polish (CMP) planarized microelectronic layer.

6. The method of claim 1 wherein the thickness variation of the microelectronic layer is effected by employing a temperature differential within various portions of the substrate when forming the microelectronic layer.

7. The method of claim 1 wherein the thickness variation is from about 1000 to about 4000 angstroms.

8. A chemical mechanical polish (CMP) planarizing method for forming a chemical mechanical polish (CMP) planarized microelectronic dielectric layer within a microelectronic fabrication comprising:

providing a substrate;

forming over the substrate a microelectronic dielectric layer; wherein the microelectronic dielectric layer, when formed over the substrate, is formed with a thickness variation which compensates for a chemical mechanical polish (CMP) rate non-uniformity of a chemical mechanical polish (CMP) planarizing method, and wherein the microelectronic dielectric layer has a greater thickness at an edge of the substrate than at the center of the substrate;

planarizing, while employing the chemical mechanical polish (CMP) planarizing method having the chemical mechanical polish (CMP) rate non-uniformity, the microelectronic dielectric layer to form a chemical mechanical polish (CMP) planarized microelectronic dielectric layer.

9. The method of claim 8 wherein the thickness variation which compensates for the chemical mechanical polish (CMP) rate non-uniformity provides the chemical mechanical polish (CMP) planarized microelectronic dielectric layer with enhanced planarity.

10. The method of claim 8 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

11. The method of claim 8 wherein the microelectronic dielectric layer is formed from a fluorosilicate glass (FSG) dielectric material.

12. The method of claim 11 wherein the fluorosilicate glass (FSG) dielectric material is deposited employing a high density plasma chemical vapor deposition (HDP-CVD) method.

13. A chemical mechanical polish (CMP) planarizing method for forming a chemical mechanical polish (CMP) planarized microelectronic dielectric layer within a microelectronic fabrication comprising:

providing a substrate;

forming over the substrate a microelectronic dielectric layer; wherein the microelectronic dielectric layer, when formed over the substrate, is formed with a thickness variation which compensates for a chemical mechanical polish (CMP) rate non-uniformity of a chemical mechanical polish (CMP) planarizing method, and wherein the microelectronic dielectric layer has a greater thickness at the center of the substrate than at an edge of the substrate;

planarizing, while employing the chemical mechanical polish (CMP) planarizing method having the chemical mechanical polish (CMP) rate non-uniformity, the microelectronic dielectric layer to form a chemical mechanical polish (CMP) planarized microelectronic dielectric layer.

14. The method of claim 8 wherein the thickness variation of the microelectronic dielectric layer is effected by employing a temperature differential within various portions of the substrate when forming the microelectronic dielectric layer.

15. The method of claim 8 wherein the thickness variation is from about 1000 to about 4000 angstroms.

16. The method of claim 5, wherein the thickness variation which compensates for the chemical mechanical polish (CMP) rate non-uniformity provides the chemical mechanical polish (CMP) planarized microelectronics layer with enhanced planarity.

17. The method of claim 5, wherein the thickness variation of the microelectronic layer is effected by employing a temperature differential within various portions of the substrate when forming the microelectronic layer.

18. The method of claim 5, wherein the thickness variation is from about 1000 to about 4000 angstroms.

19. The method of claim 13, wherein the thickness variation which compensates for the chemical mechanical polish (CMP) rate non-uniformity provides the chemical mechanical polish (CMP) planarized microelectronics dielectric layer with enhanced planarity.

20. The method of claim 13, wherein the microelectronic dielectric layer is formed from a fluorosilicate glass (FSG) dielectric material.

21. The method of claim 19, wherein the fluorosilicate glass (FSG) dielectric material us deposited employing a high density plasma chemical vapor deposition (HDP-CVD) method.

22. The method of claim 13, wherein the thickness variation of the microelectronic dielectric layer is effected by employing a temperature differential within various portions of the substrate when forming the microelectronic dielectric layer.

23. The method of claim 13, wherein the thickness variation is from about 1000 to about 4000 angstroms.

* * * * *